United States Patent
Zeller (10) Patent No.: US 10,908,245 B2
(45) Date of Patent: Feb. 2, 2021

(54) METHOD AND MAGNETIC RESONANCE APPARATUS FOR MULTI-SLICE IMAGING WITH BINOMIAL PULSES

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 49 days.

(21) Appl. No.: 16/268,881

(22) Filed: Feb. 6, 2019

(65) Prior Publication Data

US 2019/0242964 A1 Aug. 8, 2019

(30) Foreign Application Priority Data

Feb. 6, 2018 (DE) .................. 10 2018 201 810

(51) Int. Cl.
| | | |
|---|---|---|
| *G01R 33/483* | (2006.01) | |
| *G01R 33/48* | (2006.01) | |
| *G01R 33/54* | (2006.01) | |
| *G01R 33/56* | (2006.01) | |
| G01R 33/44 | (2006.01) | |

(52) U.S. Cl.
CPC ..... *G01R 33/4835* (2013.01); *G01R 33/4828* (2013.01); *G01R 33/543* (2013.01); *G01R 33/5607* (2013.01); *G01R 33/445* (2013.01)

(58) Field of Classification Search
CPC .......... G01R 33/445; G01R 33/446; G01R 33/4828; G01R 33/4835; G01R 33/543; G01R 33/5607; G01R 33/5615
See application file for complete search history.

(56) References Cited

U.S. PATENT DOCUMENTS

| | | | | |
|---|---|---|---|---|
| 5,729,138 | A  * | 3/1998  | Purdy  ................ | G01R 33/4828 324/309 |
| 8,907,673 | B2 * | 12/2014 | He ...................... | G01R 33/4828 324/314 |
| 2017/0108567 | A1* | 4/2017 | Bhat .................. | G01R 33/5611 |
| 2017/0146625 | A1 | 5/2017 | Beck et al. | |
| 2017/0146631 | A1* | 5/2017 | Beck .................. | G01R 33/5608 |
| 2018/0024214 | A1 | 1/2018 | Bhat et al. | |
| 2018/0074146 | A1 | 3/2018 | Bhat et al. | |
| 2018/0340995 | A1 | 11/2018 | Zeller | |

OTHER PUBLICATIONS

Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).

* cited by examiner

*Primary Examiner* — Steven L Yeninas (74) *Attorney, Agent, or Firm* — Schiff Hardin LLP (57) ABSTRACT

In a method and magnetic resonance (MR) apparatus for the simultaneous recording of MR signals from an examination subject with two different types of tissue in a number of slices, a first RF binomial pulse sequence for exciting at least one first slice is radiated. In addition, a second RF binomial pulse sequence for exciting at least one second slice is radiated. Furthermore, at least one RF pulse of the second binomial pulse sequence is temporarily radiated between two RF pulses of the first RF binomial pulse sequence.

23 Claims, 6 Drawing Sheets

FIG 1

*Prior Art*

FIG 3

METHOD AND MAGNETIC RESONANCE APPARATUS FOR MULTI-SLICE IMAGING WITH BINOMIAL PULSES

BACKGROUND OF THE INVENTION

Field of the Invention

The present invention concerns a method for the simultaneous recording of magnetic resonance (MR) signals from an examination subject with two different types of tissue in a number of slices. Furthermore, the invention concerns an MR system designed to implement the method for the simultaneous recording of MR signals. The present invention also concerns a non-transitory, computer-readable data storage medium encoded with programming instructions that cause a computer of an MR apparatus to operate the MR apparatus so as to implement such a method.

Description of the Prior Art

In Simultaneous Multi-Slice imaging (SMS), a number of imaging slices are excited simultaneously. A so-called multiband RF pulse is used for the excitement of the multiple slices simultaneously. For each slice to be excited, a linear phase ramp is added to a standard RF excitation pulse. This linear phase means a slice offset in the spatial domain. Subsequently, all pulse shapes are combined for all bands, which leads to a modulated multi-band pulse.

Figure 1:
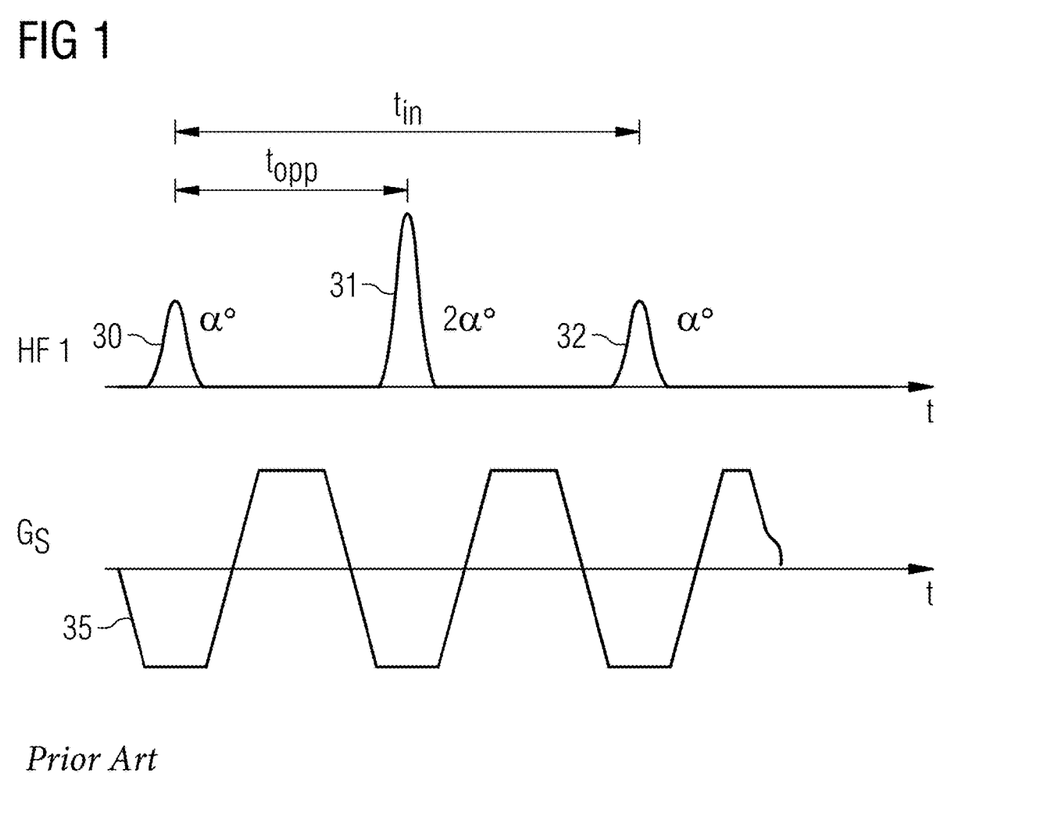
FIG. 1 schematically shows the application of a binomial pulse sequence according to the prior art.
Figure 2:
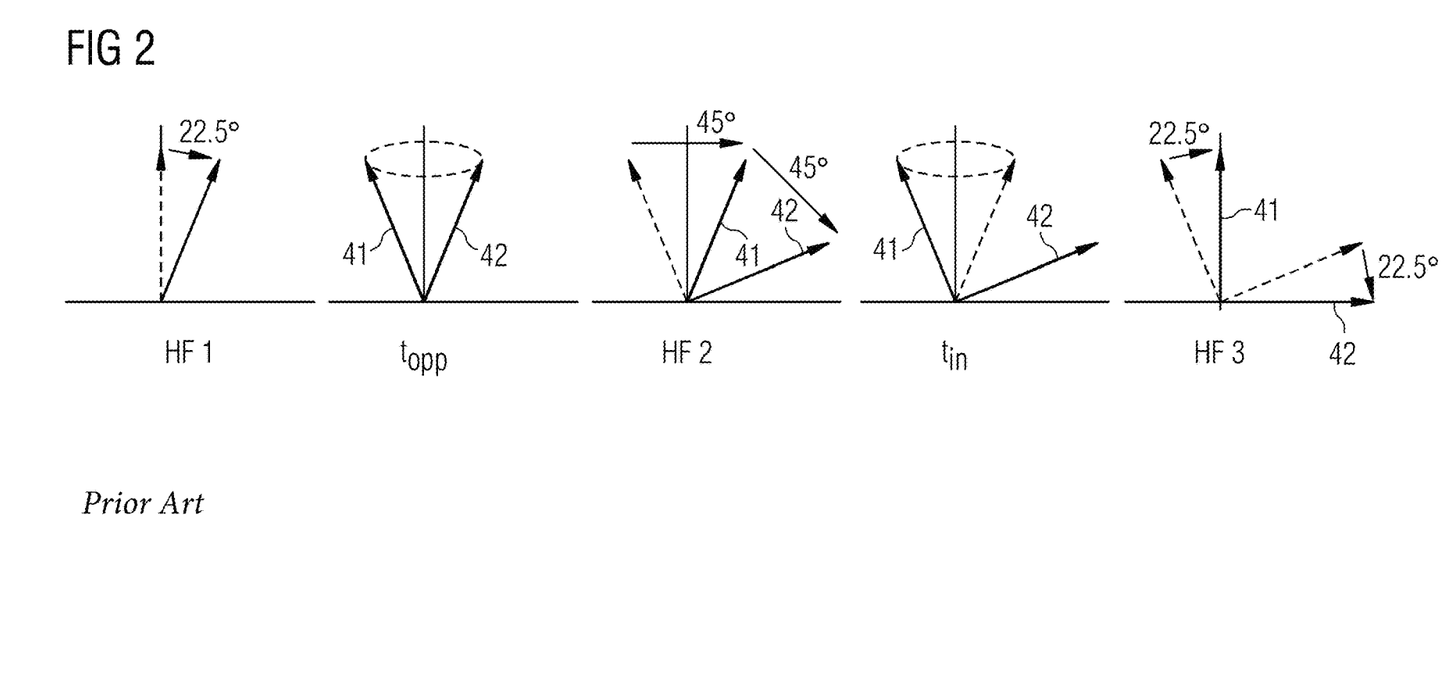
FIG. 2 shows the development of magnetization in the pulse sequence of FIG. 1.

If a fat signal is to be suppressed, the SMS imaging is typically combined with a spectral fat saturation, as is known from CHESS or SPAR, for example, or an inversion pulse which is directed at the T1 relaxation time of fat is radiated. A further fat saturation method is a method for the targeted excitation of water which in particular is used to reduce the necessary time for fat saturation, which, for example, is important for a short repetition time TR, as is necessary for EPI BOLD (echo-planar imaging blood level dependent) imaging. A pulse scheme used in this case contains a binomial-pulse train, for example, the pulse train 1-2-1 as shown in FIG. 1. The specified binomial coefficients here refer to the flip angle. As can be seen in FIG. 1, an RF pulse 30 is radiated into a tissue with two different tissue components such as fat and water, wherein in the example shown in FIG. 1 of a total of three RF pulses, the angle α is equal to 22.5°. In FIG. 2 the resulting magnetization after the first RF pulse is shown on the left. Both fat and water are excited by the RF pulse 30. After the waiting time $t_{OPP}$, the fat and water protons have an opposing phase position, as indicated by the magnetization 41 and 42 in FIG. 2. By radiating the RF pulse 31 for a double flip angle two, the magnetization 41 and 42 are tilted further in each case. After a further waiting time $t_{OPP}$, this means overall after the period $t_{in}$, the third RF pulse is radiated with the flip angle α so that overall the magnetization vector 41 for fat has no transverse magnetization, while the magnetization vector 42 for water is in the transverse plane. This binomial pulse sequence and/or the resulting magnetization after this pulse sequence can be combined with a customary signal readout, whether by means of a fast spin echo sequence or an EP sequence. As only the one magnetization is in the transverse plane, the other magnetization, here the fat signal, has no signal component in the recorded MR image.

If SMS imaging is now to be combined with the above water excitation, the challenge is that a pulse must be radiated at precisely the dephasing time $t_{opp}$, which is 1.2 ms at three Tesla and 2.4 ms at 1.5 Tesla. For this purpose, relatively high pulse amplitudes are necessary to achieve the desired flip angle. As the amplitude of the SMS pulses scales with the SMS factor, the maximum achievable amplitude for the pulse which can be provided by the MR system may be exceeded, whereby the pulse sequences then no longer have the desired flip angle relationships, as explained in connection with FIGS. 1 and 2. This leads to undesirable contrast effects in multi-slice recordings.

SUMMARY OF THE INVENTION

An object of the present invention is to provide a method for simultaneous recording of MR signals from a number of slices, wherein simultaneously two different tissue components such as fat and water, or silicone and water, and/or silicone and fat, can be separated from one another.

According to a first aspect of the invention, a method is provided for simultaneous recording of MR signals from an object of investigation with two different types of tissue in a number of slices. A first RF binomial pulse sequence for exciting at least one first slice is radiated, wherein the flip angle of the RF pulses in the first RF binomial pulse sequence are selected such that after the end of the radiation of the first RF binomial pulse sequence, one of the two types of tissue essentially has no transverse magnetization, while the other of the two magnetic tissue types has transverse magnetization. One RF pulse of the first RF binomial pulse sequence is radiated at a time at which the two different types of tissue have an opposing phase position, wherein all the pulses of the first RF binomial pulse sequence are radiated during a switching of magnetic field gradients which each have a first polarity. In addition, a second RF binomial pulse sequence is radiated to excite at least one second slice which differs from the first slice, wherein the flip angle of the RF pulses in the second RF binomial pulse sequence are likewise selected such that after the end of the radiation of the second RF binomial pulse sequence, the one type of tissue essentially has no transverse magnetization, while the other type of tissue has transverse magnetization. An RF pulse of the second RF binomial pulse sequence is radiated at a time at which the two different types of tissue have an opposing phase position, wherein all the pulses of the second RF binomial pulse sequence are radiated during a switching of the magnetic field gradients which all have a second polarity. Furthermore, at least one RF pulse of the second binomial pulse sequence is temporarily radiated between two RF pulses of the first RF binomial pulse sequence. Then the MR signals are read out from the at least one first slice and the at least one second slice simultaneously.

According to the invention, the time between two pulses of the one binomial pulse sequence is used to radiate pulses of a second binomial pulse sequence in order to excite different slices with binomial pulse sequences. The binomial pulse sequences are therefore offset with respect to one another so that in each case at least two different slices can be excited. The method has the advantage that through the offset use of the RF pulses, a reduced maximum pulse amplitude can be used, leading to an improved contrast and a better signal-to-noise ratio, wherein an SMS-like method can thus be used in the case of systems with low RF peak power.

The second polarity is preferably opposite to the first polarity. At lower field strengths of 0.5 T, for example, it is possible that there is so much time between two pulses of the pulse sequence that the magnetic field gradient is inverted, so that during the radiation of the pulse of the second binomial pulse sequence, the first and the second polarities are the same.

The RF pulses of the first binomial pulse sequence are preferably radiated alternately to the RF pulses of the second binomial pulse sequence, wherein no RF pulse of the first binomial pulse sequence is radiated at the same time as an RF pulse of the second binomial pulse sequence. As a result, optimum use can be made of the overall recording time available.

Here it is possible for the first binomial pulse sequence to have a first number of RF pulses, and the second binomial pulse sequence a second number of RF pulses that differs from the first number. For example, it is possible for the first number to differ from the second number by one RF pulse, which means that the first binomial pulse sequence has one RF pulse more than the second binomial pulse sequence. If, for example, the first binomial pulse sequence has the pulse sequence 1-2-1, then, the second binomial pulse sequence has the pulse sequence 1-1.

If the examination subject is arranged in a magnetic field with at least two different areas which have a different magnetic field homogeneity, the position of the at least one first slice and the at least one second slice is selected in such a way that the slice in which a greater number of RF pulses is used in the binomial pulse sequence is in the area with the low homogeneity of the magnetic field.

It is likewise possible for the number of RF pulses in the first and second binomial pulse sequence to be the same, wherein the RF pulses which are at the same point in the first and second binomial pulse sequence then have the same flip angle in each case.

It is likewise possible that the first binomial pulse sequence for the simultaneous excitement of at least two different slices is used, and the second binomial pulse sequence simultaneously excites two different 2-D slices. If the maximum power of the radiated RF pulses permits, each of the binomial pulse sequences may also excite two or more slices.

If an averaging of the MR signals in the respective slices is necessary and the MR signals in the at least one first and the at least one second slice are read out at least a second time, the at least one second slice can be excited with the first RF binomial pulse sequence and the at least one first slice with the second RF binomial pulse sequence the second time. As a result, the slices are recorded alternately with the different binomial pulse sequences, wherein the images can subsequently be averaged in a later step. By means of this alternating recording, slight contrast differences can be compensated, in particular if different $B_0$ inhomogeneities are present in the different slices.

Furthermore, the invention encompasses an MR system that, as explained above, can record MR signals from different slices, wherein the MR system has an image sequence control system for controlling the sequence of the RF pulses used, the magnetic field gradients and the signal readout performed. The image sequence control system is designed to execute the embodiment of the method discussed above and hereinafter.

The present invention also encompasses a non-transitory, computer-readable data storage medium encoded with programming instructions that, when the storage medium is loaded into a computer or computer system that operates an MR apparatus, in particular the MR data acquisition scanner thereof, causes the MR apparatus to implement any or all embodiments of the method according to the invention, as described above.

The features described above and the features described hereinafter can be used not only in the corresponding explicitly presented combinations but also in further combinations, unless explicitly stated otherwise.

DESCRIPTION OF THE PREFERRED EMBODIMENTS

The present invention is explained in more detail with reference to preferred embodiments with regard to the diagrams. In the figures, the same reference characters refer to the same or similar elements. Furthermore, the figures are diagrammatic views of different embodiments of the invention. The elements used in the figures are not necessarily shown to scale. The elements shown in the figures are instead reproduced in such a way that their function and their purpose are understandable to a person skilled in the art. The connections between functional units or other elements shown in the figures can also be implemented as indirect connections, wherein a connection can be wireless or wired. Functional elements can be implemented as hardware, software, or a combination of hardware and software.

Figure 3:
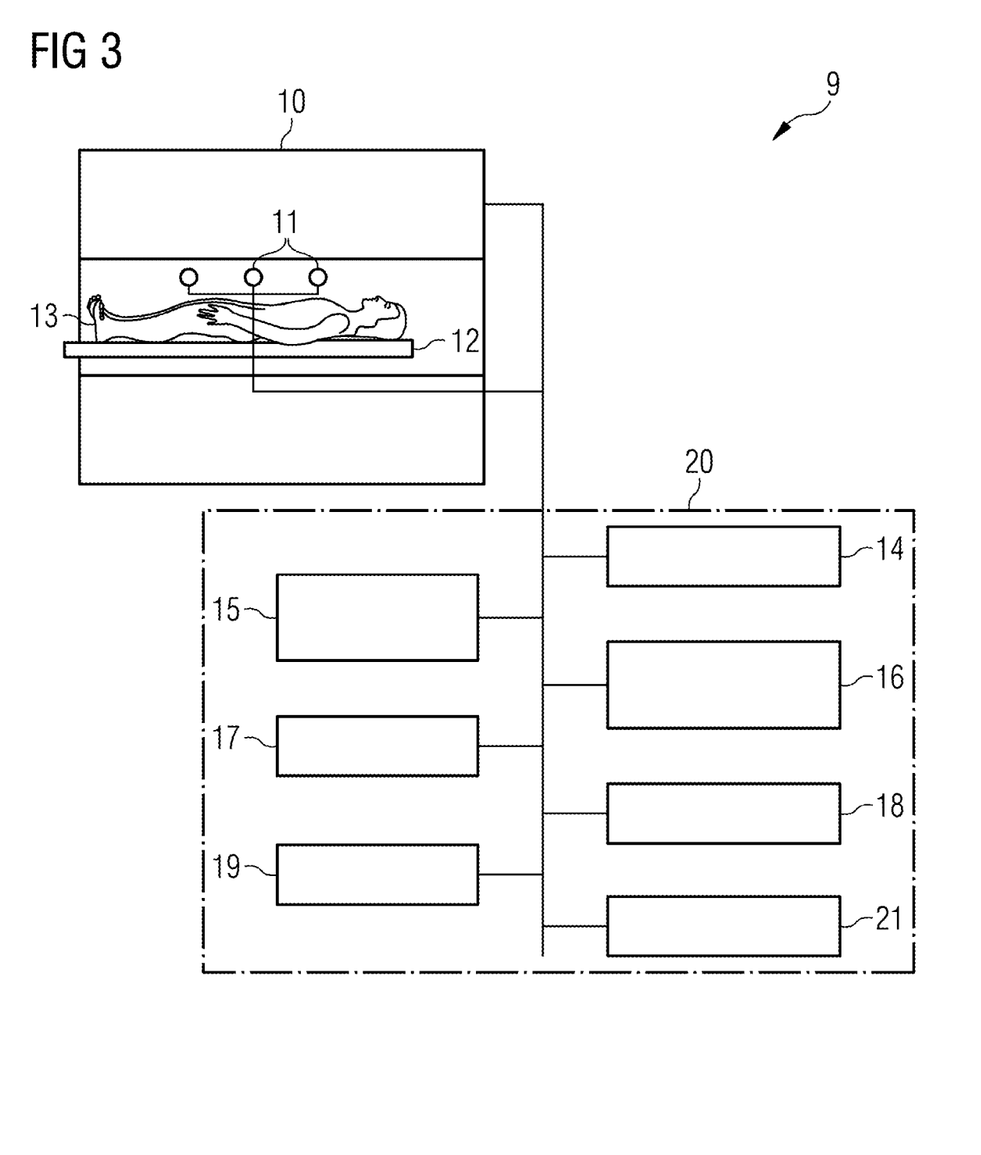
FIG. 3 schematically shows an MR system with which MR signals can be recorded from a plurality of slices according to the invention.

With regard to FIG. 3, an MR system (apparatus) is explained with which MR images from different slices can be recorded simultaneously, wherein in the case of an object of investigation with different types of tissue, only one tissue contributes to the MR signal. The MR system 9 has an MR data acquisition scanner that includes a magnet 10 for generating a polarization field $B_0$. Multiple RF receiving coils 11 are used to receive the magnetic resonance signals. The magnetic resonance signals originate from a person being examined 13 on a bed 12, who is moved into the magnet 10 to record spatially-coded magnetic resonance signals with the use of the RF receiving coils 11. The RF receiving coils 11 detect the MR signals simultaneously from a number of slices. By radiating radio-frequency pulses and switching magnetic field gradients, nuclear spins in the person 13 are given a magnetization so as to be deflected from the equilibrium position produced by the polarization field $B_0$, and spatially-coded. The resulting signals are detected by the receiving coils 11. How MR images can be generated by radiating RF pulses and by switching magnetic field gradients in various combinations and sequences is known in principle to those skilled in the art, and thus need not be explained in more detail herein.

The MR system has a control computer 20 for controlling the MR system 9. The control computer 20 has an RF controller 14 for controlling and generating RF pulses to deflect magnetization. A gradient controller 15 is provided for controlling and switching the necessary magnetic field gradients. An image sequence controller 16 controls the sequence of the magnetic field gradients, the signal detection and the RF pulses and thus also controls the gradient controller 15, the receiving coils 11 and the RF controller 14. An operator can operate the MR system 9 via an input unit 17 and the MR images and other information necessary for control can be shown on a display 18. A processor 19 is provided for controlling the various units in the control computer 20. Furthermore, a memory 21 is provided in which, for example, program modules and/or program resources can be stored that, when executed by the control computer 20 and/or the processor 19 embodied therein, control the sequence of the MR system. As explained below, the image sequence control system and thus the control computer 20 are designed such that MR signals can be detected simultaneously from a number of slices and the separation of two tissue components such as fat and water or fat and silicone or silicone and water is possible.

Figure 4:
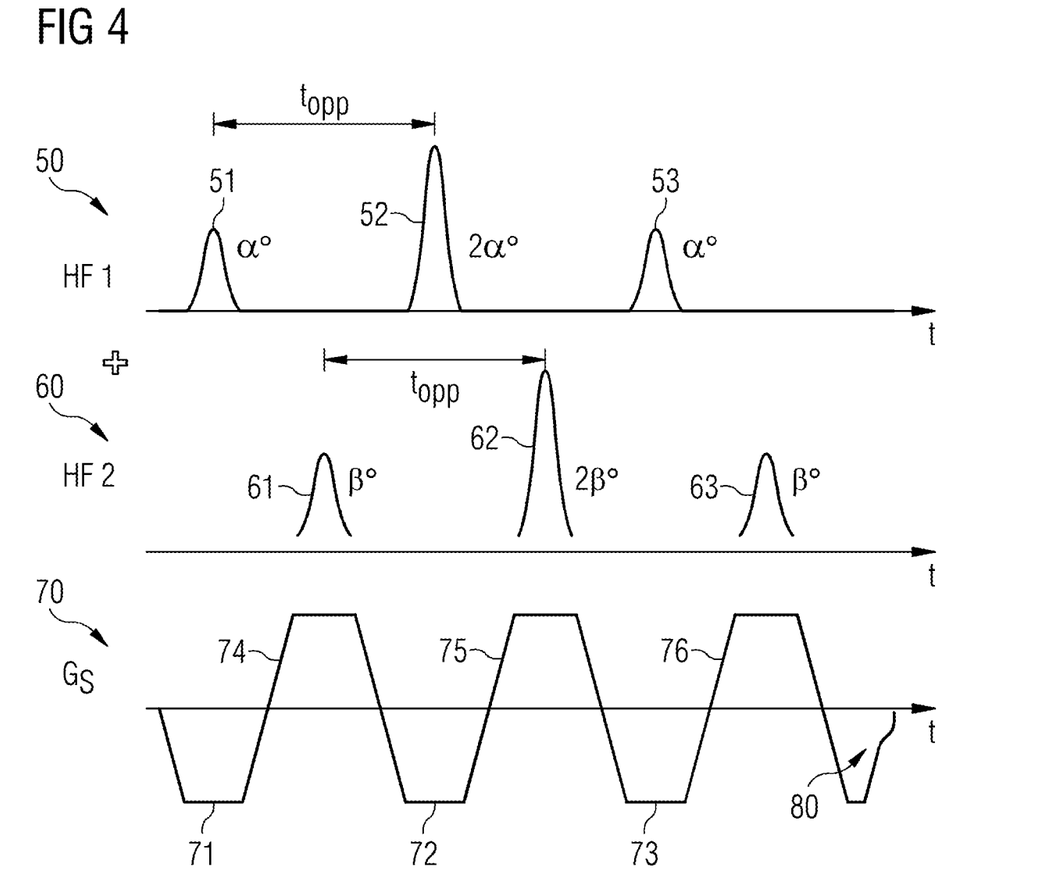
FIG. 4 shows how two different binomial pulse sequences can be used to excite different slices according to the invention.

FIG. 4 shows a first embodiment of the invention in which a first RF binomial pulse sequence 50 and a second RF binomial pulse sequence 60 are radiated into the person being examined 13. The first pulse sequence 50 has a first RF pulse 51 with a flip angle $\alpha$, followed by a second RF pulse 52 with a double flip angle $2a$. As explained in connection with FIGS. 1 and 2, the time interval between the two pulses is such that two different tissue components such as, for example, fat and water, have an opposing phase position at the time of radiation of the RF pulse 52. The RF pulse 53 with the flip angle $\alpha$ then occurs again in the same time interval, so that at the end, after the radiation of the RF pulse 53, transverse magnetization is present for the one tissue component, while the other tissue component has no transverse magnetization. The angles $\alpha$ can be the flip angles used in FIG. 2, but other flip angles can also be used if at the end the one magnetization is not to be deflected by 90° but by another amount. The switching of the RF pulses of the first binomial pulse sequence takes place during the switching of a sequence 70 of magnetic field gradients, wherein the RF pulses 51, 52 and 53 are switched, while the associated slice selection gradient has a first polarity, here the negative polarity as represented by the gradient sections 71, 72 and 73.

The second binomial pulse sequence 60 is radiated into the object of investigation for the excitement of at least one second slice, wherein the radiation of the second RF binomial pulse sequence ensues offset with respect to the first RF binomial pulse sequence in such a way that the associated RF pulses 61, 62 and 63 are radiated during the opposite gradient moment, during the gradient sections 74, 75 and 76 with the angles $\beta$, $2\beta$, $\beta$. In the example shown in FIG. 4, the pulse sequence 60, like the pulse sequence 50, is 1-2-1. The angle $\beta$ can be equal to the angle $\alpha$, but this is not essential.

In short, in FIG. 4 this means that the binomial pulses for the one slice are radiated during the positive gradient moments, while the binomial pulse sequences for the other slice are radiated during the negative gradient moments. In addition, a further magnetic field gradient 80, which rephases the phase of both excited slices, follows at the end after the radiation of the last RF pulse of the two pulse sequences.

Figure 5:
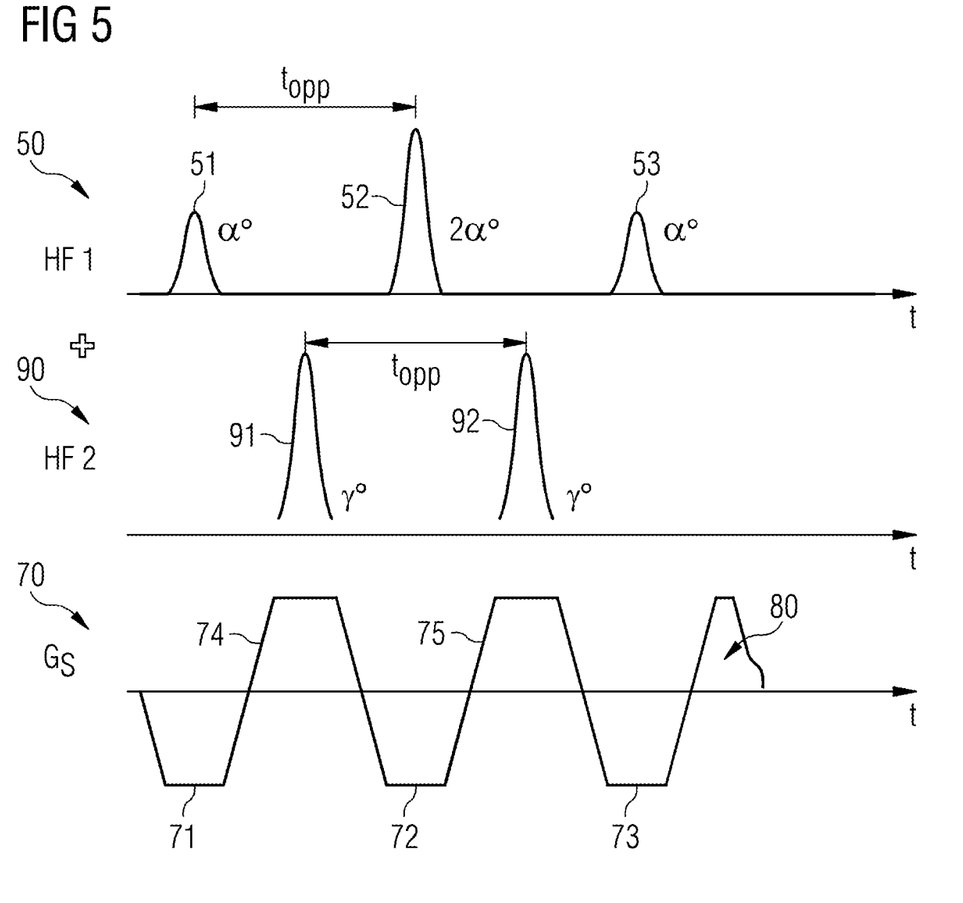
FIG. 5 schematically shows another way in which two binomial pulse sequences can be used to excite different slices according to the invention.

FIG. 5 shows a further embodiment in which the number of RF pulses differs in the two pulse sequences. The first pulse sequence 50 corresponds to the pulse sequence of FIG. 4 with the RF pulses 51, 52 and 53. The second pulse sequence 90 differs from the pulse sequence of FIG. 4 in that this pulse sequence has a different number of RF pulses, namely in the illustrated example 2, an RF pulse 91 which is switched during the positive gradient moment 74, and an RF pulse 92 which is switched during the gradient moment 75. Likewise, the angles $\gamma$ differ from the angle $\beta$ of FIG. 4. If a 90° excitation is desired for the one magnetization, for example, the water, the angle $\gamma$ is 45°. However, other angles are also possible if a smaller flip angle is desired for the one tissue component.

At the end after the last RF pulse of the two pulse sequences, the gradient switching 70 in turn has the further magnetic field gradients 80 for refocusing all the phases in the two slices.

Figure 7:
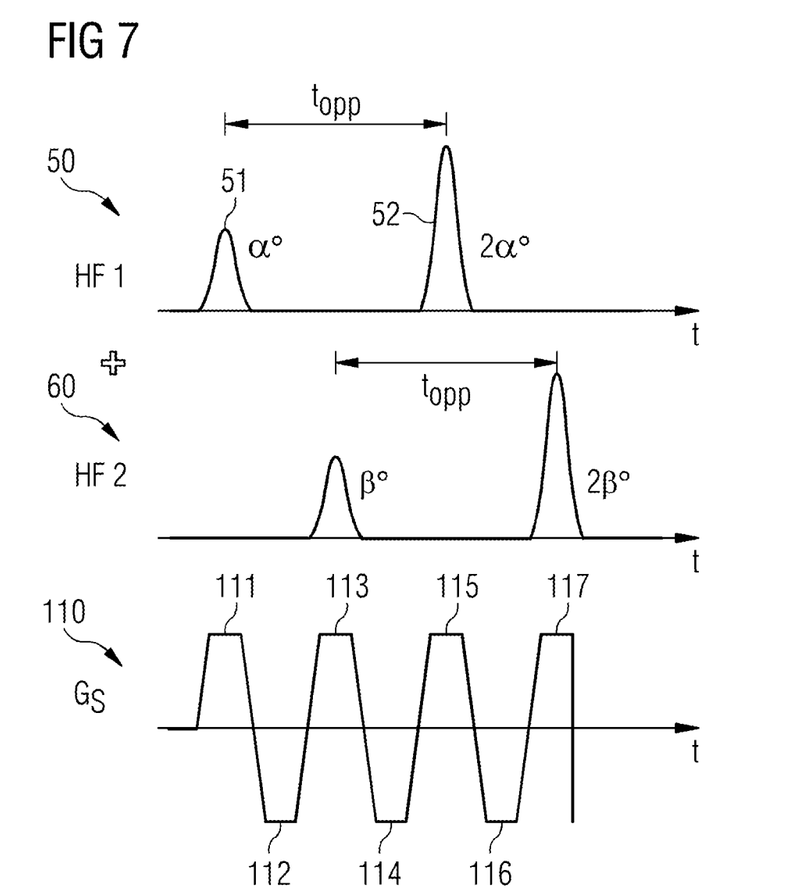
FIG. 7 shows a further way in which two binomial pulse sequences can be used to excite different slices according to the invention.

FIG. 7 shows a further embodiment which is used in particular, but not exclusively, for low-field devices with field strengths of, for example, 0.5 T. Only part of the switching similar to FIG. 4 is shown in FIG. 7. At 0.5 T, $t_{OPP}$ is so long that it is possible to refocus the magnetic field gradients, Gs, before the RF pulse of the second slice is radiated. All the RF pulses of the binomial pulse sequences for the first and second slice are thus switched during the positive gradient moments 111, 113, 115 and 117 and not at the negative gradient moments 112, 114, 116. The embodiment otherwise corresponds to the gradient switching 110 of the embodiment of FIG. 4, and thus also has the further magnetic field gradients 80 (not shown), but gradient switching 110 can also be used in the embodiment of FIG. 5.

Figure 6:
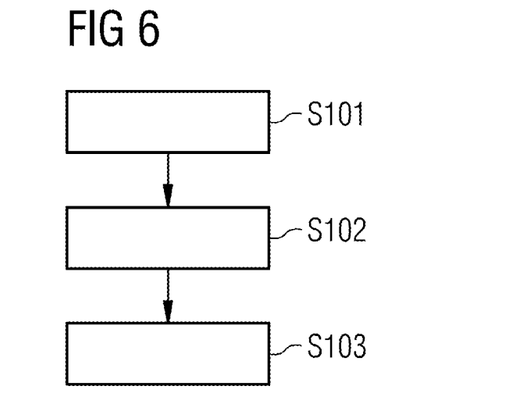
FIG. 6 is a flowchart with the steps which are performed for the inventive recording of MR signals from different slices, wherein in each case the signal from a tissue component is suppressed.

In the examples shown in FIGS. 4, 5 and 6, the signal echoes in the two slices have an offset of $t_{OPP}/2$, which is equivalent to 0.6 ms at three Tesla, which may be desired depending on the application or is negligible. The separation of the simultaneously recorded signals for the individual coils can be carried out as known in the prior art.

The embodiment shown in FIG. 5 has the advantage that overall the expenditure of time for the preparation of magnetization is minimized as the RF pulses for the second slice are between the RF pulses for the first slice and no additional expenditure of time is therefore necessary.

The saturation of the one tissue component, for example of the fat, may be different for both slices when, for example, greater $B_0$ field inhomogeneities are present.

This problem can be solved in that the areas and/or slices with a greater magnetic field inhomogeneity use the pulse train which has a greater number of RF pulses, for example, in FIG. 5 of the pulse train 50 with three RF pulses, while in the slice with the greater magnetic field homogeneity the pulse train 90 is radiated with two RF pulses.

A further possibility for reducing different contrasts is to perform a plurality of acquisitions of the individual slices, wherein the slices and/or the applied pulse trains are exchanged and each slice is thus recorded alternately by one pulse train and alternately by another pulse train. Signal averaging then takes place in a later step.

The schemes shown in FIGS. 4 to 6 are only two different possibilities for different binomial sequences. Of course, other binomial sequences such as 1-3-3-1 can also be used. Likewise, the flip angles $\alpha$, $\beta$ and $\gamma$ and the pulse phases can be varied, whereby the contrast and the tissue component to be saturated can be varied in slices, wherein fat or water or silicone is wholly or partially saturated and wherein this variation is possible for each slice. By changing the intervals between the pulses in a binomial pulse, the chemical component which is to be saturated can be selected. If the maximum RF amplitude is sufficient to radiate a complete SMS pulse, it can mean that the pulse sequences 50, 60 or 90 shown in FIGS. 4 and 5 each excite not only one slice, but a plurality of slices. Thus, overall a plurality of slices can be excited simultaneously with the binomial pulse sequence.

FIG. 6 is a flowchart that combines the steps for the simultaneous recording of MR signals from an object of investigation with different types of tissue. In a first step S101, a first binomial pulse sequence is radiated into at least one first slice, wherein the pulses of the first binomial pulse sequence such as, for example, the pulse sequence 50, are radiated during the switching of magnetic field gradients which have a first polarity. In the examples shown in FIGS. 4 and 5, this was the negative polarity. Furthermore, in a further step S102, the radiation of the second RF binomial pulse sequence takes place to excite the at least one further slice. All the RF pulses of the second RF binomial pulse sequence are offset with respect to the radiation of the RF pulse of the first binomial pulse sequence during the switching of the magnetic field gradients, which preferably have an opposite polarity, as can be seen in FIGS. 4 and 5. In a step S103, the MR signals of the first and second slice are read out simultaneously. The steps S101 to S103 are not necessarily carried out one after the other as can also be seen from FIGS. 4 and 5. Different possibilities, whether it be EPI, gradient echoes or spin echoes can be used for the signal readout.

The aforementioned scheme can be used as an imaging sequence block and can be combined with different readout modules, whether it be EPI, a gradient echo or a spin echo. Furthermore, the sequence described above can be used as a preparation block for imaging, for example, for fat or water saturation.

Overall the method described above enables the use of reduced maximum power for RF radiation, whereby the simultaneous read-out of signals from a plurality of slices is possible. The method described above can also be used in situations when only a fat-saturated image recording is necessary.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for simultaneous acquisition of magnetic resonance (MR) signals from a plurality of slices in an examination subject, said slices comprising two different types of tissue, said method comprising:

operating a radio-frequency (RF) radiator of an MR data acquisition scanner to radiate a first RF binomial pulse sequence that excites nuclear spins in a first slice of said plurality of slices, said first RF binomial pulse sequence comprising RF pulses having respective flip angles that, after an end of radiation of said first RF binomial pulse sequence, cause one of said two types of tissue to have no transverse magnetization and the other of said two types of tissue to have a transverse magnetization, with one RF pulse among said pulses of said first RF binomial pulse sequence being radiated at a time at which said two different types of tissue have opposite phases, with all pulses of said first RF binomial pulse sequence being radiated during activation of magnetic field gradients, having a first polarity, by gradient coils of said MR data acquisition scanner;

operating said RF radiator of said MR data acquisition scanner to radiate a second RF binomial pulse sequence that excites nuclear spins in a second slice of said plurality of slices, said second RF binomial pulse sequence comprising RF pulses having respective flip angles that, after an end of radiation of said second RF binomial pulse sequence, cause one of said two types of tissue to have no transverse magnetization and the other of said two types of tissue to have a transverse magnetization, with one RF pulse among said pulses of said second RF binomial pulse sequence being radiated at a time at which said two different types of tissue have opposite phases, with all pulses of said second RF binomial pulse sequence being radiated during activation of magnetic field gradients, having a second polarity, by gradient coils of said MR data acquisition scanner, with at least one RF pulse of said second RF binomial pulse sequence being temporarily radiated between two RF pulses of said first RF binomial pulse sequence; and operating RF reception coils of said MR data acquisition scanner to simultaneously read out MR signals from the respective nuclear spins excited in said first and second slices, and entering said MR signals into an electronic memory so as to form a data file, and making said data file available in electronic form from a computer having access to said memory.

2. A method as claimed in claim 1 wherein said readout of said MR signals is a first readout, and comprising:

operating said RF radiator of said MR data acquisition scanner to excite said nuclear spins in said second slice with said first RF binomial pulse sequence and to excite said nuclear spins in said first slice with said second RF binomial pulse sequence; and thereafter operating said RF reception coils of said MR data acquisition scanner to implement a second readout of MR signals from said first and second slices.

3. A method as claimed in claim 1 comprising operating said RF radiator of said MR data acquisition scanner to radiate said first RF binomial pulse sequence with a first number of RF pulses and to radiate said second RF binomial pulse sequence with a second number of RF pulses that differs from said first number.

4. A method as claimed in claim 3 comprising operating said RF radiator of said MR data acquisition scanner to radiate said first RF binomial pulse sequence with one more RF pulse than said second RF binomial pulse sequence.

5. A method as claimed in claim 3 comprising:

operating a basic field magnet of said MR data acquisition scanner to produce a magnetic field, in which said examination subject is situated, having two different magnetic field areas with respectively different homogeneities; and positioning said examination subject in said MR data acquisition scanner so that one of said first or second slices, into which a larger number of said RF pulses is radiated, is in a magnetic field area having a lower homogeneity.

6. A method as claimed in claim 1 comprising operating said RF radiator of said MR data acquisition scanner to radiate said first and second binomial pulse sequences with a same number of RF pulses in each sequence, with respective RF pulses occurring at a same point in time in the respective first and second RF binomial pulse sequences having a same flip angle.

7. A method as claimed in claim 1 comprising operating said RF radiator of MR data acquisition scanner to use one of said first or second RF binomial pulse sequences to simultaneously excite nuclear spins in at least two different slices among said plurality of slices.

8. A method as claimed in claim 1 comprising operating said gradient coils of said MR data acquisition scanner to activate, after radiating a last RF pulse in each of said first and second RF binomial pulse sequences, a magnetic field gradient that rephases the phase of said nuclear spins in said first slice and in said second slice.

9. A method as claimed in claim 1 comprising operating said RF radiator of said MR data acquisition scanner to radiate the Rf pulses of said first binomial pulse sequence in alternation with radiating said RF pulses of said second RF binomial pulse sequence, with no RF pulse of said first binomial sequence being radiated at a same time as an RF pulse of said second RF binomial pulse sequence.

10. A method as claimed in claim 1 comprising operating said gradient coils of said MR data acquisition scanner with said second polarity being opposite to said first polarity.

11. A method as claimed in claim 1 comprising operating said gradient coils of said MR data acquisition scanner with said first polarity and said second polarity being the same.

12. A magnetic resonance (MR) apparatus for simultaneously acquiring MR signals from a plurality of slices of an examination subject, said slices comprising two different types of tissue, said MR apparatus comprising:
an MR data acquisition scanner comprising a radio-frequency (RF) radiator, gradient coils, and RF reception coils;
a computer configured to operate said RF radiator to radiate a first RF binomial pulse sequence that excites nuclear spins in a first slice of said plurality of slices, said first RF binomial pulse sequence comprising RF pulses having respective flip angles that, after an end of radiation of said first RF binomial pulse sequence, cause one of said two types of tissue to have no transverse magnetization and the other of said two types of tissue to have a transverse magnetization, with one RF pulse among said pulses of said first RF binomial pulse sequence being radiated at a time at which said two different types of tissue have opposite phases, with all pulses of said first RF binomial pulse sequence being radiated during activation of magnetic field gradients, having a first polarity, by gradient coils of said MR data acquisition scanner;
said computer being configured to operate said RF radiator to radiate a second RF binomial pulse sequence that excites nuclear spins in a second slice of said plurality of slices, said second RF binomial pulse sequence comprising RF pulses having respective flip angles that, after an end of radiation of said second RF binomial pulse sequence, cause one of said two types of tissue to have no transverse magnetization and the other of said two types of tissue to have a transverse magnetization, with one RF pulse among said pulses of said second RF binomial pulse sequence being radiated at a time at which said two different types of tissue have opposite phases, with all pulses of said second RF binomial pulse sequence being radiated during activation of magnetic field gradients, having a second polarity, by said gradient coils, with at least one RF pulse of said second RF binomial pulse sequence being temporarily radiated between two RF pulses of said first RF binomial pulse sequence; and
said computer being configured to operate RF reception coils to simultaneously read out MR signals from the respective nuclear spins excited in said first and second slices, and to enter said MR signals into an electronic memory so as to form a data file, and to make said data file available in electronic form from said computer.

13. An MR apparatus as claimed in claim 12 wherein said readout of said MR signals is a first readout, and wherein:
said computer is configured to operate said RF radiator to excite said nuclear spins in said second slice with said first RF binomial pulse sequence and to excite said nuclear spins in said first slice with said second RF binomial pulse sequence; and
said computer is configured to thereafter operate said RF reception coils to implement a second readout of MR signals from said first and second slices.

14. An MR apparatus as claimed in claim 12 wherein said computer is configured to operate said RF radiator to radiate said first RF binomial pulse sequence with a first number of RF pulses and to radiate said second RF binomial pulse sequence with a second number of RF pulses that differs from said first number.

15. An MR apparatus as claimed in claim 14 wherein said computer is configured to operate said RF radiator of said MR data acquisition scanner to radiate said first RF binomial pulse sequence with one more RF pulse than said second RF binomial pulse sequence.

16. An MR apparatus as claimed in claim 14 comprising:
a basic field magnet in said MR data acquisition scanner that produces a magnetic field, in which said examination subject is situated, having two different magnetic field areas with respectively different homogeneities; and
a bed operated by said computer to position said examination subject in said MR data acquisition scanner so that one of said first or second slices, into which a larger number of said RF pulses is radiated, is in a magnetic field area having a lower homogeneity.

17. An MR apparatus as claimed in claim 12 wherein said computer is configured to operate said RF radiator to radiate said first and second binomial pulse sequences with a same number of RF pulses in each sequence, with respective RF pulses occurring at a same point in time in the respective first and second RF binomial pulse sequences having a same flip angle.

18. An MR apparatus as claimed in claim 12 wherein said computer is configured to operate said RF radiator to use one of said first or second RF binomial pulse sequences to simultaneously excite nuclear spins in at least two different slices among said plurality of slices.

19. An MR apparatus as claimed in claim 12 wherein said computer is configured to operate said gradient coils to activate, after radiating a last RF pulse in each of said first and second RF binomial pulse sequences, a magnetic field gradient that rephases the phase of said nuclear spins in said first slice and in said second slice.

20. An MR apparatus as claimed in claim 12 wherein said computer is configured to operate said RF radiator to radiate the Rf pulses of said first binomial pulse sequence in alternation with radiating said RF pulses of said second RF binomial pulse sequence, with no RF pulse of said first binomial sequence being radiated at a same time as an RF pulse of said second RF binomial pulse sequence.

21. An MR apparatus as claimed in claim 12 wherein said computer is configured to operate said gradient coils with said second polarity being opposite to said first polarity.

22. An MR apparatus as claimed in claim 12 wherein said computer is configured to operate said gradient coils with said first polarity and said second polarity being the same.

23. A non-transitory, computer-readable data storage medium encoded with programming instructions, said storage medium being loaded into a computer of a magnetic resonance (MR) apparatus comprising an MR data acquisition scanner, said programming instructions causing said computer to:

operate a radio-frequency (RF) radiator of said MR data acquisition scanner to radiate a first RF binomial pulse sequence that excites nuclear spins in a first slice of said plurality of slices, said first RF binomial pulse sequence comprising RF pulses having respective flip angles that, after an end of radiation of said first RF binomial pulse sequence, cause one of said two types of tissue to have no transverse magnetization and the other of said two types of tissue to have a transverse magnetization, with one RF pulse among said pulses of said first RF binomial pulse sequence being radiated at a time at which said two different types of tissue have opposite phases, with all pulses of said first RF binomial pulse sequence being radiated during activation of magnetic field gradients, having a first polarity, by gradient coils of said MR data acquisition scanner;

operate said RF radiator of an MR data acquisition scanner to radiate a second RF binomial pulse sequence that excites nuclear spins in a second slice of said plurality of slices, said second RF binomial pulse sequence comprising RF pulses having respective flip angles that, after an end of radiation of said second RF binomial pulse sequence, cause one of said two types of tissue to have no transverse magnetization and the other of said two types of tissue to have a transverse magnetization, with one RF pulse among said pulses of said second RF binomial pulse sequence being radiated at a time at which said two different types of tissue have opposite phases, with all pulses of said second RF binomial pulse sequence being radiated during activation of magnetic field gradients, having a second polarity, by gradient coils of said MR data acquisition scanner, with at least one RF pulse of said second RF binomial pulse sequence being temporarily radiated between two RF pulses of said first RF binomial pulse sequence; and operate RF reception coils of said MR data acquisition scanner to simultaneously read out MR signals from the respective nuclear spins excited in said first and second slices, and enter said MR signals into an electronic memory so as to form a data file, and make said data file available in electronic form from a computer having access to said memory.

* * * * *